United States Patent [19]

Dozier

[11] Patent Number: 4,640,223
[45] Date of Patent: Feb. 3, 1987

[54] CHEMICAL VAPOR DEPOSITION REACTOR

[76] Inventor: Alfred R. Dozier, 9075 Meadowrun Way, San Diego, Calif. 92129

[21] Appl. No.: 853,690

[22] Filed: Apr. 18, 1986

Related U.S. Application Data

[60] Continuation-in-part of Ser. No. 634,146, Jul. 24, 1984, abandoned, which is a division of Ser. No. 306,697, Sep. 21, 1981, abandoned.

[51] Int. Cl.$^4$ ............................................. C23C 13/08
[52] U.S. Cl. .................................... 118/719; 118/725; 118/728; 118/729; 118/730; 118/733
[58] Field of Search ............... 118/728, 729, 719, 725, 118/730, 733

[56] References Cited

U.S. PATENT DOCUMENTS

| | | | |
|---|---|---|---|
| 3,098,763 | 7/1963 | Deal | 118/725 |
| 3,456,616 | 7/1969 | Gleim | 118/725 |
| 3,549,847 | 12/1970 | Clark | 118/725 |
| 3,568,632 | 3/1971 | Cawthon | 118/719 |
| 3,749,383 | 7/1973 | Voigt | 118/729 |
| 3,796,182 | 3/1974 | Rosler | 118/728 |
| 3,922,467 | 11/1975 | Pinchon | 118/500 |
| 3,931,789 | 1/1976 | Kakei | 118/730 |
| 4,062,318 | 12/1977 | Ban | 118/725 |
| 4,108,106 | 8/1978 | Dozier | 427/82 |
| 4,201,152 | 5/1980 | Luscher | 118/729 |
| 4,256,053 | 3/1981 | Dozier | 118/728 |
| 4,348,580 | 9/1982 | Drexel | 219/390 |
| 4,412,812 | 11/1983 | Sadowski | 432/121 |

FOREIGN PATENT DOCUMENTS

| | | | |
|---|---|---|---|
| 67573 | 6/1977 | Japan | 118/729 |
| 110030 | 8/1980 | Japan | 118/728 |
| 10228 | 1/1982 | Japan | 422/245 |

Primary Examiner—Richard Bueker
Attorney, Agent, or Firm—Donald D. Mon

[57] ABSTRACT

A chemical vapor deposition reactor for deposition on substrates, for example silicon epitaxial depositions. The apparatus includes a heating chamber in which a reactor is placed. Means of heating the substrates in the reactor is spaced from the reactor. The reaction chamber is positioned in the heating chamber. It has a load/unload opening outside of the heating chamber and an exhaust port. A reactant distribution means receives and discharges reactants into the reaction chamber. A wafer carrier holds a plurality of wafer retainers. It is moved in and out of the reaction chamber by moving means. A seal closes the reaction chamber opening when the wafer carrier is placed in the reaction chamber. A conditioning chamber is located adjacent to the reaction chamber and includes a door. Preconditioning of the wafers before introduction in to the reaction chamber, and subsequent cooling outside of the reaction chamber, can be accomplished in the conditioning chamber.

36 Claims, 12 Drawing Figures

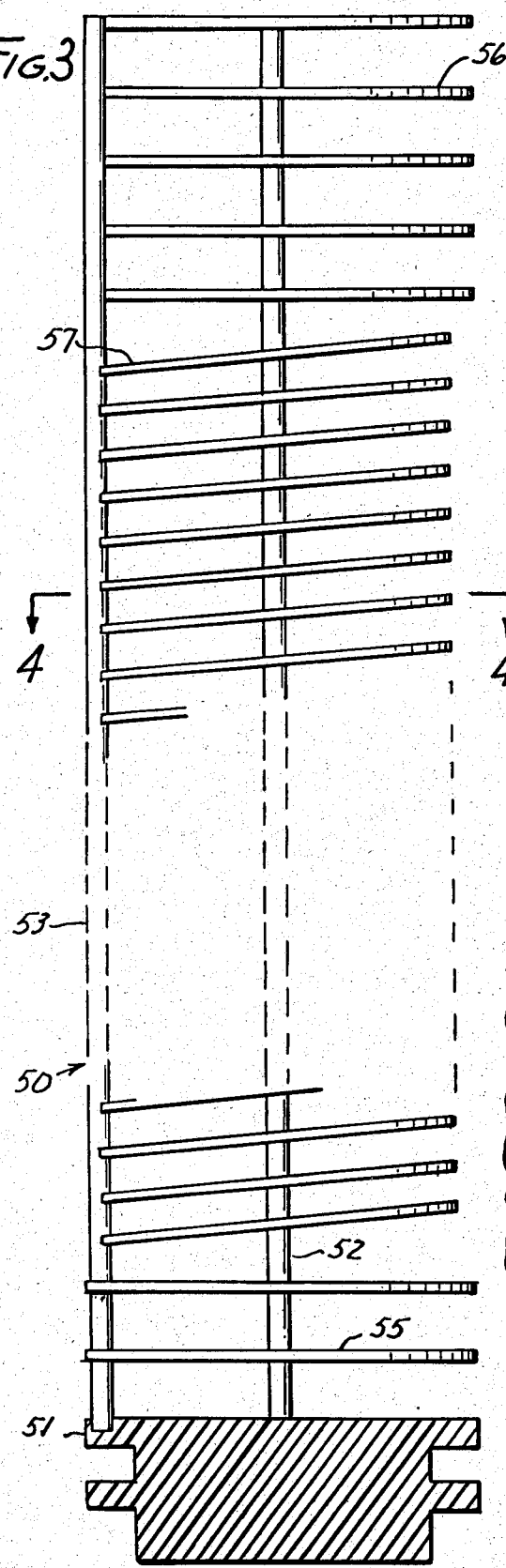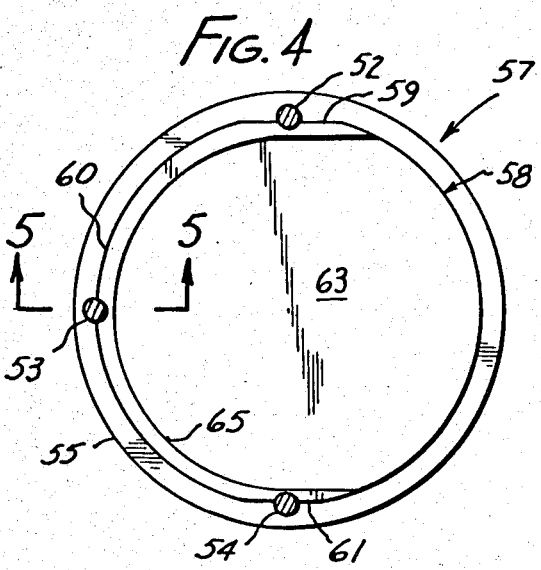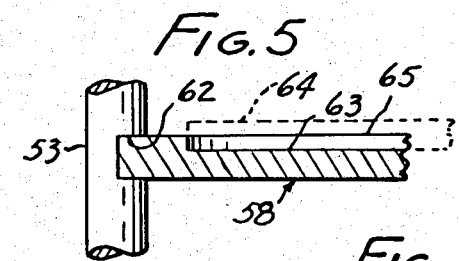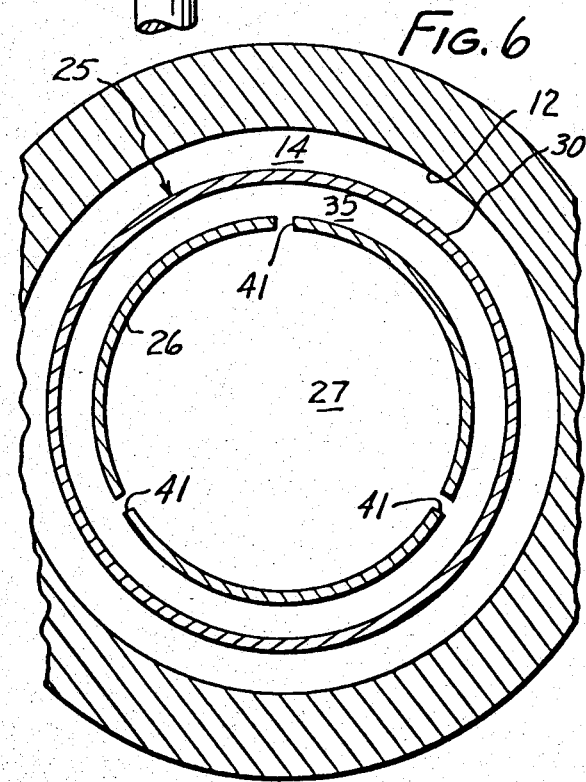

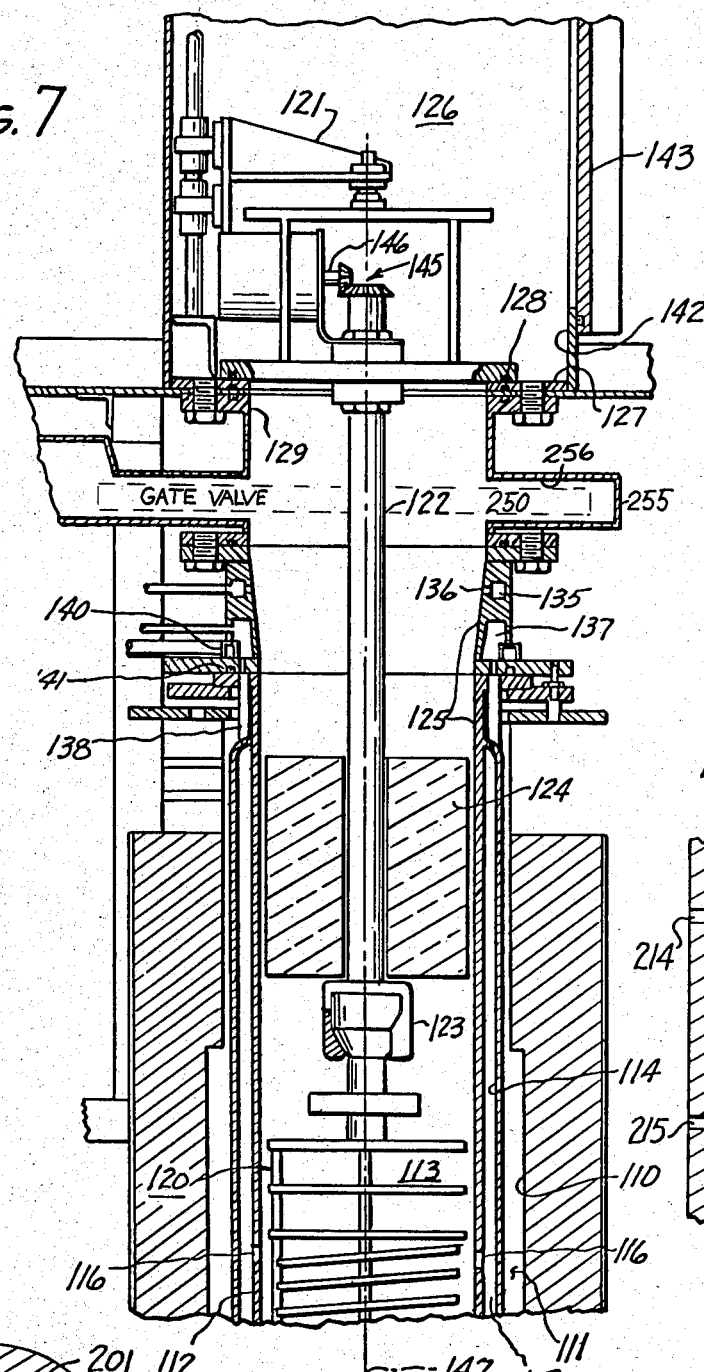
Fig. 7
Fig. 9
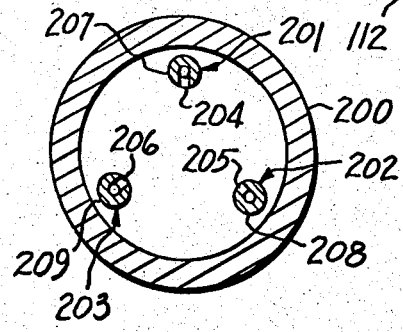
Fig. 8

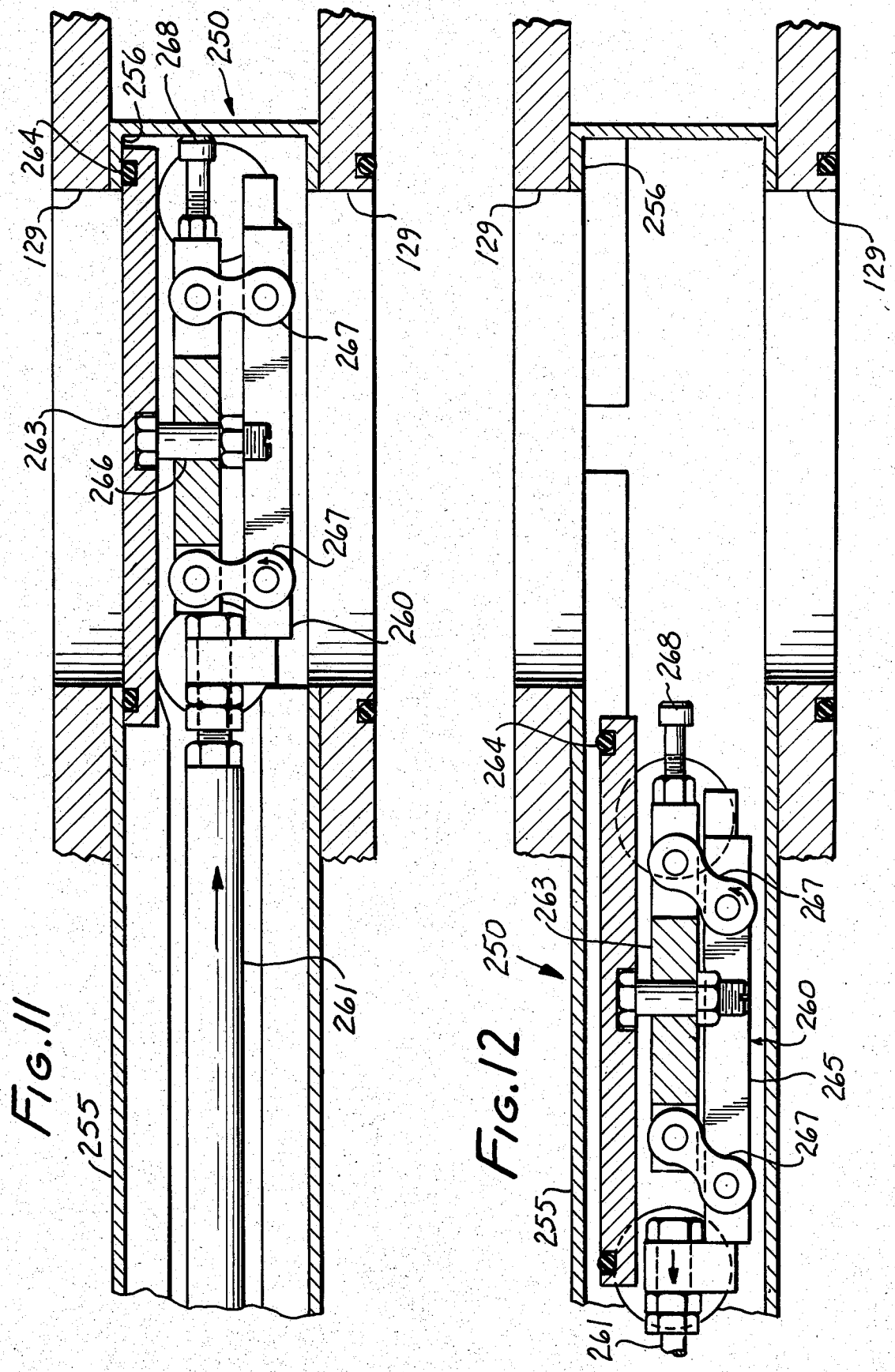

CHEMICAL VAPOR DEPOSITION REACTOR

CROSS-REFERENCE TO OTHER APPLICATIONS

This is a continuation in part of applicant's presently copending U.S. patent application Ser. No. 634,146, filed July 24, 1984, now abandoned, entitled "Chemical Vapor Deposition Reactor", which is in turn a division of Ser. No. 306,697, filed Sept. 21, 1981, now abandoned.

FIELD OF THE INVENTION

This invention relates to apparatus for chemical vapor deposition of substrates, for example silicon epitaxial deposition.

BACKGROUND OF THE INVENTION

Apparatus for silicon epitaxial chemical vapor deposition of substrates, for example of silicon wafers, is known. Generally speaking, such apparatus utilizes a cold wall. The walls of such apparatus are hundreds of degrees cooler than the reaction temperature, and the energy that is lost by radiation through them is often on the order of about 32 watts per square cm. at 1200 degrees C. In order to keep cold walled reactor walls cool they have to radiate heat. This energy loss must continually be made up to sustain deposition, and it represents a substantial element of cost. The energy conversion efficiency of the heating means in cold wall reactors is in the area of 50%. These conversion losses also add to power cost.

Accordingly, this invention has an objective to provide apparatus with substantially greater productivity and substantially lower energy requirement. Compared to many conventional machines, the apparatus of this invention has per unit time about 5 times the productivity, and utilizes less than 20% of the energy per unit output. The reaction chamber can accommodate more wafers. It requires less energy because radiation from the system is repressed.

It is an object of this invention to utilize apparatus having a hot wall, wherein the energy loss is by inefficiency of the insulation, which is minimal, and the end losses into the reactor base.

Also, in the treatment of single crystalline substrates, uniformity of heating and cooling across the crystal is essential, because if it exceeds a relatively small tolerance, slip will occur within the crystal planes. This crystalographic slippage renders useless the area where it occurs. It is an object of this invention to provide apparatus wherein the system can be operated at high throughputs and efficiencies, and in which deposition parameters can be substantially improved.

BRIEF DESCRIPTION OF THE INVENTION

Apparatus acccording to this invention includes a heater enclosure having a wall that forms a heating chamber therein. Said heater chamber has openings at each end of said wall. A reactor is placed in the heater chamber which fits in and closes the heater enclosure openings. The reactor has a reaction chamber wall which defines a reaction chamber and which makes a sealing fit in one opening of the heating chamber. It opens outside of the heating chamber. A reactant distribution means receives reactants and discharges them into the reaction chamber. A wafer carrier is so proportioned, arranged and mounted as to be at least partially insertable into and removable out of the reaction chamber through the opening of the reaction chamber. The wafer carrier includes a support and a plurality of retainers mounted to the support. Each retainer comprises a retainer plate made of pyrolitic graphite, or other material upon a surface of which a wafer to be treated is supported in surface-to-surface contact therewith. The retainers are spaced apart from one another sufficiently that a surface of each wafer will be exposed to reactant gases. Moving means includes a base adapted to carry the wafer carrier, whereby to move the wafer carrier into and out of the reaction chamber. Seal means closes the opening in an interface region when the wafer carrier is in the reaction chamber.

Reactant passage means enters the reactant distribution means and is accessible from the outside of the heater chamber for introducing reactants into the reactant distribution means and thence into the reaction chamber.

According to a preferred but optional feature of the invention, the heater enclosure wall is generally tubular.

According to yet another preferred but optional feature of the invention, a conditioning chamber is disposed adjacent to the opening to the reaction chamber. It includes a door and means adapted to move the wafer carrier into and out of the conditioning chamber. First moving means inside the conditioning chamber serve to move the wafer carrier into and out of the reaction chamber. The conditioning chamber can be utilized for preconditioning the wafers before, and/or for cooling the wafers after the wafer carrier is inserted into or withdrawn from the reaction chamber.

According to still another preferred but optional feature of the invention, a gate valve is disposed in the opening to the reaction chamber so that the reaction chamber can be closed whether the wafer carrier is in the reaction chamber or not, and whether or not the closure which can accompany the carrier is in the reaction chamber opening or not.

The above and other features of the invention will be fully understood from the following detailed description and the accompanying drawings, in which:

BRIEF DESCRIPTION OF THE DRAWINGS

FIG. 3 is an axial cross-section of a portion of FIG. 2;

FIG. 4 is a cross-section taken at line 4—4 in FIG. 3;

FIG. 5 is a fragmentary cross-section taken at line 5—5 in FIG. 4;

FIG. 6 is a fragmentary cross-section taken at line 6—6 in FIG. 1 with the wafer carrier removed;

FIG. 7 is a fragmentary view showing portions of another embodiment of the invention;

FIG. 8 is a cross-section of a variation of the reactant distribution means;

FIG. 9 is an axial cross-section showing still another variation of the reaction distribution means;

FIGS. 11 and 12 are side views of the gate valve of FIG. 10, in a closed and in an open condition, respectively.

DETAILED DESCRIPTION OF THE INVENTION

Figure 1:
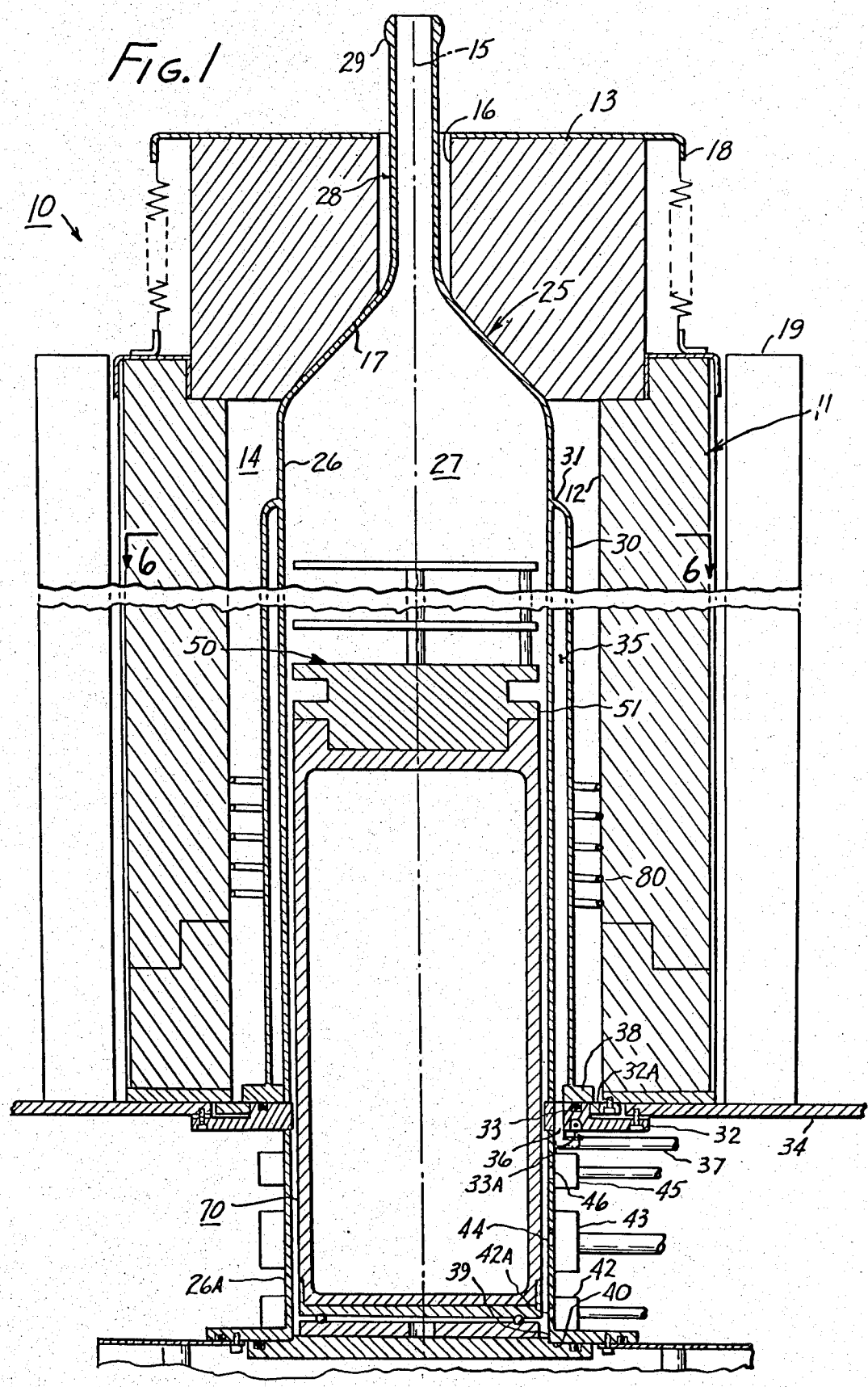
FIG. 1 is an axial view, principally in cutaway cross-section, showing the upper portion of apparatus according to this invention.
Figure 2:
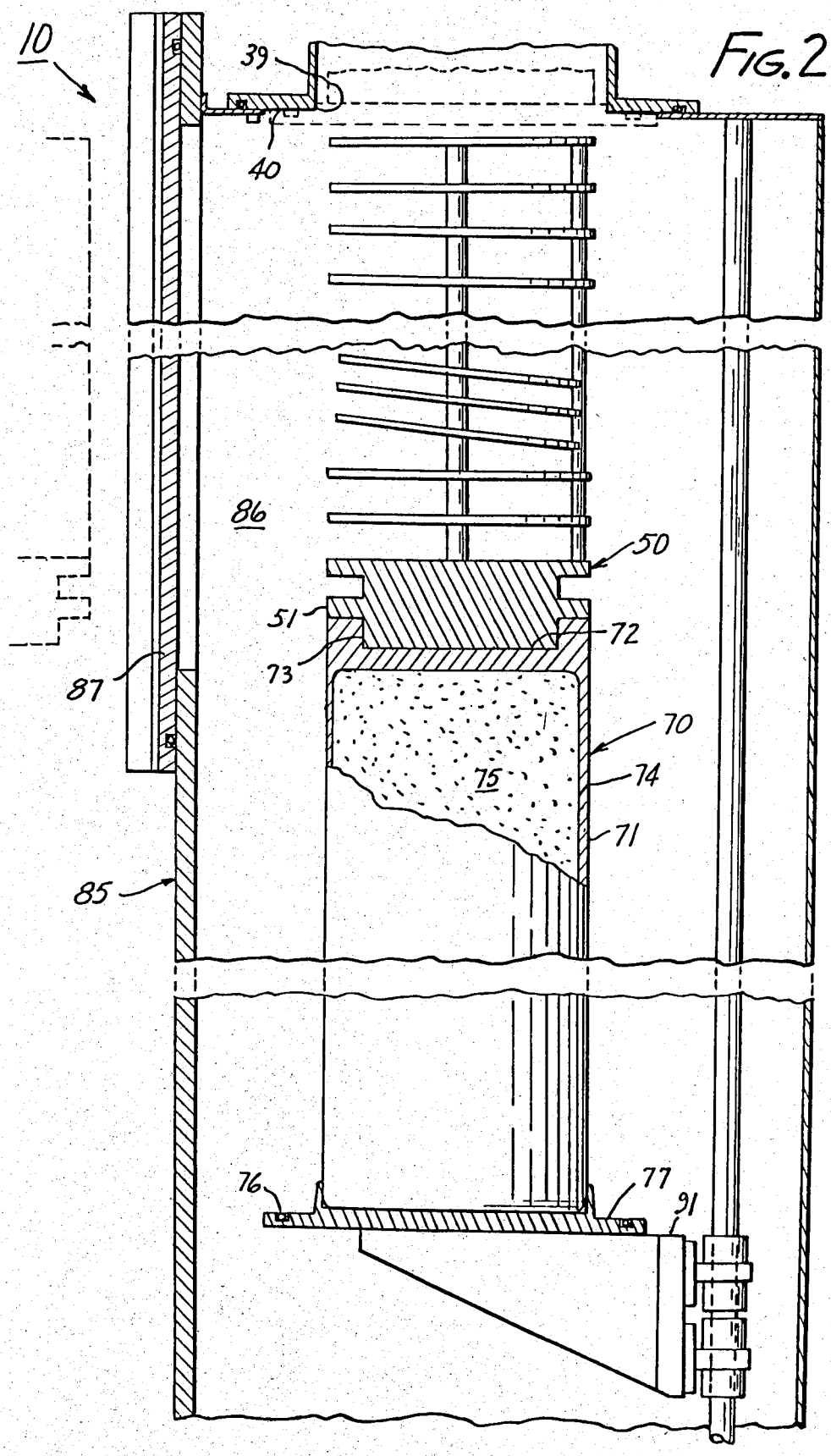
FIG. 2 is a similar view, for a lower portion of the invention, FIGS. 1 and 2 abutting and overlapping one another at their bottom and top, respectively.

FIGS. 1 and 2 overlap bottom to top with one another, FIG. 1 being above FIG. 2 These Figs. show one embodiment of apparatus 10 according to this invention. A heater enclosure 11 comprises a tubular wall 12 having an end closure 13. It forms an internal heating chamber 14. The closure and the heating chamber have a central axis 15. The end closure has an aperture 16 with a tapered portion 17. The end closure is held to the tubular wall by a suitable retention means 18.

Electrical resistance heater means 80 is mounted to the heater enclosure wall. It is a helical wire extending for the full length of the heating chamber. To simplify the drawings, only a portion of it is shown. Appropriate connections are provided to energize the heater means.

A reactor 25 is generally tubular. It is co-axial with axis 15. It includes a reaction chamber wall 26 that forms a reaction chamber 27 inside it. It tapers to a neck 28. The taper is seated in tapered portion 17. Neck 28 has a nipple 29 for connection to an exhaust or vacuum pump.

Co-axial with and surrounding the reaction chamber wall there is a reactant distribution chamber wall 30 which is sealed to reaction chamber wall 26 by welding. The reaction chamber wall 26 is welded to flange member 38. Flange 38 is held in place by flange 32A and is sealed by O-ring 33 in flange 32. The heater enclosure 11 is supported on a base member 34. A reactant distribution chamber means 35 is formed between walls 26 and 30.

Passage means 36 opens into reactant distribution chamber 35, and by means of conduit 37 (of which there can be one or more), is connectable to one or more sources of supply of reactant material such as process gases.

An interface region between the reaction chamber 27 and a conditioning chamber 86 is formed just below flange 32 which is welded to tubular wall 26A which in turn is welded to flange 40. An opening 39 into the reaction chamber is formed within flange 40.

A hollow ring 33A is provided for a cooling seal 33. It has supply and exhaust connections (not shown) to provide coolants to the ring.

On interface chamber wall 26A there are three hollow rings welded to the outer wall for specific purposes. Ring 43 is for connection to an exhaust or vacuum pump. Holes 44 through the interface region wall 26A enter into this ring and provide for that flow. Rings 45 and 42 are for supplying purging gases such as hydrogen or nitrogen as required in the operation of the system. Holes 46 and 42A in interface wall 26A provide for this flow.

Families of ports 41 (FIG. 6) are formed through the reaction chamber wall 26 to provide for flow of reactant gas from the reactant distribution chamber 35 to reaction chamber 27. These are preferably formed in groups of three, disposed 120 degrees apart from one another, with the groups spaced along the axis of the reaction chamber. It will be understood that the illustrated complete peripheral surrounding of the reaction chamber wall by the reactant distribution chamber wall is not necessary. Other supply means could be provided such as reactant distribution conduits inside or outside the reaction chamber FIGS. 8 and 9. However the illustrated construction is simple to manufacture and uniform in its properties.

A wafer carrier 50 is best shown in FIGS. 2-5. This carrier is adapted to be inserted into the reaction chamber for processing of substrates. It includes a mount means 51 in the nature of a round plug which is undersized relative to the inside diameter of the reaction chamber wall. To it there are mounted three supports 52, 53, and 54. These supports are rods rigidly attached to the mount means. They extend axially when the wafer carrier is inserted in the tube. Nearest the mount means there are several disc-shaped heat shields 55 which are attached to the supports. Several similar heat shields 56 are located at the top of the carrier. The supports pass through the heat shields and are welded in their established positions.

Next there is a plurality of perhaps as many as thirty retainers 57. The retainers are all identical, so that only one will be described here, with further reference to FIGS. 4 and 5. Each retainer comprises a retainer plate 58 which has a generally circular outer periphery except for three indexing means (flats) 59, 60 and 61 formed 90 degrees apart from one another which fit precisely into matching grooves in the supports.

Each retainer plate has a flat top surface 63 upon which a wafer 64 can rest in flat surface-to-surface contiguity. A shoulder 65 extends for about 210 degrees around the periphery of the top surface to position the wafer and retain it in its place.

The retainer plates are preferably made of pyrolitic graphite. Pyrolitic graphite has a pronounced grain, and its grain will extend substantially parallel to surface 63 for purposes and for reasons yet to be described.

Moving means 70 (FIG. 2) is provided to move the wafer carrier into and out of the reaction chamber. It includes a plug 71 which has a top recess 72 adapted to fit closely with a mating part 73 on the bottom of the wafer carrier base 51. Insulating material 74 such as quartz wool is placed inside a cavity 75 in the plug 71. At its bottom end, base 77 carries a seal 76 which overhangs and is adapted to make an abutting fluid sealing contact with seal surface 40 when the wafer carrier is inserted into the reaction chamber.

A conditioning chamber wall 85 forms conditioning chamber 86. There is a door 87 through it for access to load and unload the wafer carrier. When the wafer carrier is in alignment with axis 15, feed mechanism 91 can move it into and out of the reaction chamber. The wafer carrier with its wafers may reside in the conditioning chamber for preliminary heating or other conditioning, and after removal for cooling or post conditioning. It will be recognized that there can be more than one door, so that the wafers can be fed from several directions into or out of the conditioning chamber. Moving means (not shown) can be provided to move the carrier through door 87, and into alignment with the first moving means so it can be engaged by the latter, and moved into and out of the reaction chamber. Also, it can be used to "park" the carrier in the chamber at other places, and also can remove the carrier. Such a moving means may be as simple as a track and carriage, the carriage being movable.

As to materials of construction, the reactor will be made of quartz and the quartz parts can be welded (fused) together by classical quartz welding techniques. Similarly, the heat shields and support rods of the wafer carrier can all be quartz and be welded together by conventional techniques. The wafer retainer plates are made of pyrolitic graphite or other materials as previously mentioned. The balance of the system including the interface region and the conditioning chamber will be made of 300 series stainless steel.

It is an advantage of this invention that the reaction chamber can always be kept at or very near to its operating temperature so it is not heated up or cooled down during operation. This saves considerable time in processing, which is often wasted in other systems where they cycle the reactor temperature. Power losses are minimized by providing good insulation, and by eliminating conversion losses. This contrasts sharply with the loss of energy in cool wall machines, where losses in the order of 32 watts per square cm. at 1200 degrees C. are normal because they have to radiate heat to keep the walls cool.

In the processing according to this invention it is essential that the wafer be heated and cooled uniformly to avoid crystal slip. When slip occurs, product must be scrapped. A 10 degrees–15 degrees C. gradient across the wafer can result in slip. With heating of the type shown and described, since the wafer receives and loses heat first at its edge, heating or cooling of the wafers edge will ordinarily be more pronounced than heating or cooling in the central area of the wafer. If there were no compensation for this situation, then some crystal slip would almost certainly occur. Tilting the wafer to expose more of its surface to heater radiation helps. But, by utilizing pyrolitic graphite for the retainers with the grain properly orientated, a retainer of high thermal conductivity is provided when the carbon platelets are all lined up with these reaction grains in the same direction. The thermal conductivity is greatly increased in that direction although it is less in directions normal to the plane of the platelets. Utilizing pyrolitic graphite for the retainers results in a profound improvement of uniformity of temperature across the wafer, and substantially eliminates crystal slip.

In order to reduce the region at the edge of the wafer where product can not be made, and to improve deposition uniformity, the wafer carrier can advantageously be rotated around its axis during processing. This can be accomplished by rotating the moving means by conventional drive means.

Reduced pressure within the reaction chamber will lengthen the diffusion path of deposition molecules and will further increase film uniformity. This device can be operated at pressures from atmospheric to only a fraction of a Torr.

When cooling the wafers, one must be cautious to avoid crystal slip especially in the temperature range between about 1200 degrees C. to about 600 degrees C. The use of pyrolitic graphite and the shape of the retainers with their improved thermal conductivity along with retainer tile will greatly reduce the risk of crystal slip during cooling.

In the example shown (FIG. 3), the retainers are tilted at about 15 degrees to the horizontal and it will be noted that the far edge of one is about on the level of the near edge of the other. The gas emanating from the ports will tend to flow across the wafer. Posts 41 are shown only in FIG. 6 to simplify the drawings. The wafers could be held horizontally but a suitable angle is preferable. It is also preferable for the reactant materials to enter from several directions, which is the reason they are located about 60 to 120 degrees from one another. An example of the use of this invention is the process of silicon epitaxial vapor deposition in the manufacture of microcircuits.

The wafer carrier can be inserted into the reaction chamber from below or from above. In FIGS. 1–6 it is inserted from below. However, there are advantages to inserting it from above, and the central portion of such a system is shown in FIG. 7, which is the presently-preferred embodiment of the invention. The unshown portions at the upper and lower ends of FIG. 7 are functionally the same as those in FIGS. 1–6, except, of course, that they are inverted, the conditioning chamber being located above the heater chamber in the embodiment.

A heating chamber wall 110 forms a heating chamber 111. A reaction chamber wall 112 forms a reaction chamber 113. A reactant distribution chamber wall 114 forms a reactant distribution chamber 115 with wall 112. Ports 116 interconnect chambers 113 and 115 as in FIGS. 1–6.

Resistance heater means (not shown) are provided as in FIGS. 1–6.

Wafer carrier 120 is suspended from moving means 121 by a rod 122 and a coupler 123. An insulation plug 124 makes a close but not sealing fit with wall 122. Wafer carrier 120 is indentical in all functional respects to wafer carrier 50.

An interface wall 125 is formed above where plug 124 is formed, and below conditioning chamber 126.

Flange 127 and seal 128 combine to close opening 129 when the wafer carrier is inserted into the reaction chamber.

A purge gas ring 135 has openings 136 entering wall 125. Reactant supply ring 137 feeds to a conduit 138 that leads to the reactant distribution chamber. A coolant ring 140 serves to cool a seal 141.

Conditioning chamber wall 142 has a door 143 to allow wafer carriers to be moved into and out of the conditioning chamber by moving means (not shown). The conditioning chamber is a closed structure, and has sufficient lateral dimensions to accommodate the carriers and equipment that are to be placed in it.

A pair of miter gears 145 engage one another so that a driven shaft 146 can rotate rod 122 to rotate the wafer carrier around its axis 147.

Appropriate heating and cooling means (not shown) can be provided from the conditioning chamber should this be required, in all embodiments.

FIG. 8 shows that it is not a limitation on the invention that the reactant distribution means be formed in part by the wall of the reaction chamber, or that it be located outside of the reaction chamber. A reaction chamber wall 200 is formed without ports through its side, and one or more (in this case, three) reactant distribution conduits 201, 202, 203 (sometimes called "reactant distribution means") are placed inside the reaction chamber. These are tubular conduits, and have ports 204, 205, 206 through their respective walls 207, 208, 209 at appropriate elevations as in the other embodiments. These discharge toward a wafer carrier (not shown) inside the reaction chamber as in the other embodiments.

As shown in FIG. 9, it is equally possible to place one or more of these conduits outside of and adjacent to a reaction chamber wall 210. One such conduit 211 ("reactant distribution chamber" or "reactant distribution means") is shown with branches 212, 213, respectively discharging through ports 214, 215 through wall 210 into the reaction chamber, as in the embodiments of FIGS. 1–7.

This invention enables wafers to be introduced into an already hot heating chamber. In the prior art, they have been introduced into a cold chamber. Then the chamber is heated, the wafers processed, the chamber cooled, and the wafers removed. The waste of time and energy is obvious. Although it is possible to preheat the wafers in the conditioning chamber, it is ordinarily unneccessary. The purpose of the conditioning chamber is mainly to provide wafer conditioning such as cleaning and an atmosphere generally similar to that which exists in the reaction chamber before the wafers are put into it.

The system as described above, with only seal 76 to close the reaction chamber opening 39 by abutting against flange 40, can be used to process the materials as described. However, because only one seal is provided, if it is desired to close the reacton chamber at opening 39 while performing certain other operations, it may be necessary to "park" a carrier in the conditioning chamber while the opening is closed by seal 76.

It is more convenient to provide valve means respective to opening 39 that is independent of the carrier at all times. A gate valve 250 is shown in FIG. 7 for this purpose. It is disclosed in the embodiment of FIG. 7, but is equally useful in the embodiment of FIG. 1, and this disclosure should be read accordingly.

Figure 10:
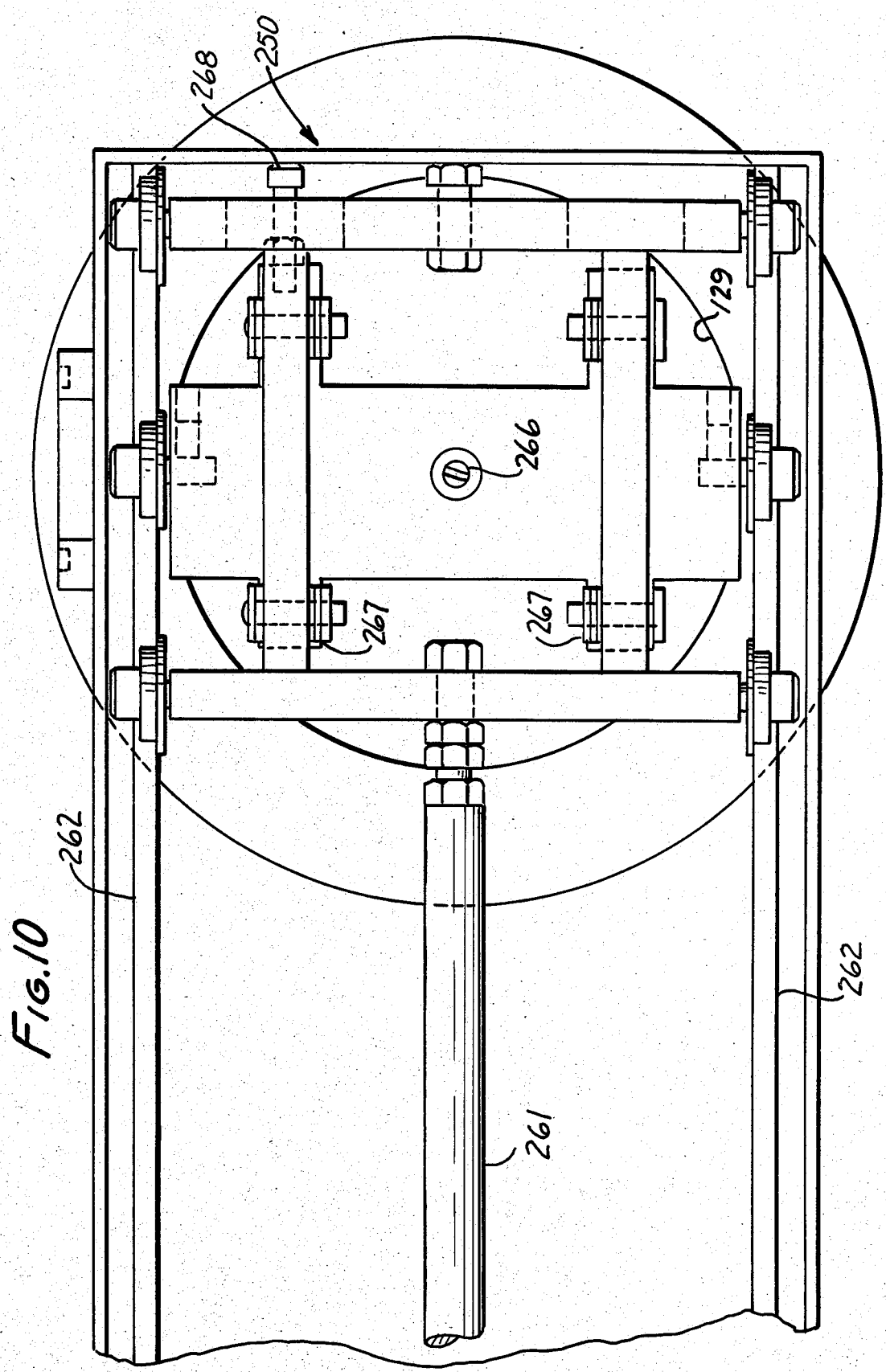
FIG. 10 is a plan view of a gate valve useful with this invention.

Opening 129 will be closed by seal 128 when the carrier is suspended in the reaction chamber as shown. As a supplementary closure, gate valve 250 is fitted in a housing 255 in the opening to the reaction chamber. It is adapted to close against surface 256, but can do so only when wafer carrier 120 is not in the illustrated position. The housing is, of course, closed from the atmosphere. For this reason, gate valve 250 is shown only schematically in FIG. 7. Its structural details are fully shown in FIGS. 10, 11 and 12.

Gate valve 250 has a carriage 260 which is reciprocably movable into and out of opening 129. An actuating rod 261 extends through the housing with appropriate seals against leakage, and drives the carriage. The carriage is supported on tracks 262. A closure plate 263 bears peripheral face seal 264. It is mounted to a support plate 265 by a post 266 and moves in synchronism with it. Parallelogram links 267 are pivotally mounted to the carriage and to the closure plate. When in the FIG. 11 position, they space the closure plate farthest from the carriage and press it to close the opening by moving seal 264 against face 256. Adjustable stop 268 limits this movement. This position occurs when the rod is pushed the farthest to the right in FIGS. 11 and 12.

To open opening 129 and move the gate valve aside, the rod is pulled to the left. Spring means (not shown) tend to rotate the parallelogram links as shown, removing seal 264 from the face 256, and then drawing the carriage aside so it no longer occludes the opening.

Now the system is more conveniently put to use, because the reaction chamber can be closed by means other than the seal which is also, at least at some times, used to manipulate the carrier.

It is evident that more than one carrier can be employed, and that more than one carrier can be in the conditioning chamber at any given time, if desired. For example, carrier can be "pushed" without closures, if preferred.

It is also evident from the foregoing that the moving means which moves the carrier into and out of the conditioning chamber need not be the same as that which moves it into and out of the reaction chamber, although of course it can be. If desired, the second moving means (not shown but described above) can be used for this purpose, and is able to transfer the carrier to a "parking" means, or to the moving means which will move it into the reaction chamber.

It will be noted that it is unnecessary for the interior of the reaction chamber ever to be directly exposed to the atmosphere while in operation.

This invention thereby provides apparatus for the epitaxial chemical vapor deposition treatment of substrates, for example silicon wafers. The details of the operation will be readily understood by persons skilled in the art and require no further discussion here.

This invention is not to be limited by the embodiments shown in the drawings and described in the description which are given by way of example and not of limitation, but only in accordance with the scope of the appended claims.

I claim:

1. Apparatus within which to conduct processes of silicon epitaxial chemical vapor deposition on substrate wafers, said apparatus comprising:

a heating enclosure comprising a heating enclosure wall which forms a heating chamber therein, said heating enclosure wall having a heating chamber opening therethrough and being insulated against loss of heat;

a reactor in said heating chamber, fitting in and closing said heating enclosure opening, said reactor including a heatable reaction chamber wall which is impermeable to gases and defines a reaction chamber and which makes a sealing fit in the opening in the heating chamber wall and itself has an opening through said reaction chamber wall which opens outside of said heating chamber, and reactant distribution means for receiving reactant and adapted to discharge reactant into said reaction chamber;

heater means in said heating chamber for heating said reaction chamber wall;

a wafer carrier so proportioned, arranged, and mounted as to be at least partially insertable into, and removable out of, said reaction chamber through said opening in said reaction chamber wall, said wafer carrier including support means to support said wafers spaced apart from one another so that at least one surface of each said wafer will be exposed in said reaction chamber;

closure means adapted to open and to close said opening in said reaction chamber to pass said wafer carrier and to seal said opening respectively;

reactant passage means entering said reactant distribution means, and being accessible from outside of said heating chamber for introducing reactants into said reactant distribution means, and thence into said reaction chamber;

a conditioning chamber aligned with said reaction chamber, said conditioning chamber including door means through which said wafer carrier can be placed in and removed from the interior of said conditioning chamber;

means for providing an atmosphere in said conditioning chamber which is not incompatible with the atmosphere which will exist in the reaction chamber when the wafer carrier is inserted into the reaction chamber; and first moving means adapted to move said wafer carrier into and out of said reaction chamber, said wafer carrier being movable into and out of said conditioning chamber, whereby said wafer carrier can be moved into and out of said reaction chamber without direct communication of the reaction chamber with conditions external to the conditioning chamber.

2. Apparatus according to claim 1 in which said heating enclosure wall is generally tubular, with one end closed and the other end formed with said heating chamber opening.

3. Apparatus according to claim 1 in which said reaction chamber wall is tubular.

4. Apparatus according to claim 3 in which said reactant distribution means includes a wall which is tubular and co-axial with said reaction chamber wall, ports being formed in said reaction chamber wall to pass reactant into said reaction chamber.

5. Apparatus according to claim 4 in which said support means extends axially in said reaction chamber, and in which said ports from said reactant distribution means are axially spaced apart along the length of said reaction chamber.

6. Apparatus according to claim 1 in which said retainer is made of pyrolytic graphite, in which pyrolytic graphite has an oriented platelet structure and in which said platelet structure extends in general alignment with said surface.

7. Apparatus according to claim 6 in which said retainers include a shoulder extending around at least part of said surface.

8. Apparatus according to claim 1 in which a purging passage and an exhaust passage open into said reaction chamber and are accessible from outside of said heating chamber for supplying a purging gas, and for exhausting gas from said reaction chamber.

9. Apparatus according to claim 1 in which said wafer carrier includes a heat shield at each end of the group of supports.

10. Apparatus according to claim 1 in which a peripheral coolant ring surrounds said reaction chamber flange outside of said reaction chamber adjacent to said opening, said coolant ring including means for supplying and exhausting coolant fluid to and from said ring.

11. Apparatus according to claim 3 in which said reaction chamber has an exhaust port spaced from the points of entry of the reactant passage means into said reaction chamber.

12. Apparatus according to claim 1 in which said moving means includes an insulating plug adjacent to said wafer carrier.

13. Apparatus according to claim 1 in which said support means are slanted, and in which there is at least one of said ports directed into the region between each adjacent pair of said support means.

14. Apparatus according to claim 13 in which said reaction chamber wall is tubular.

15. Apparatus according to claim 14 in which said reactant distribution means includes a wall which is tubular and coaxial with said reaction chamber wall, ports being formed in said reaction chamber wall to pass reactant into said reaction chamber.

16. Apparatus according to claim 14 in which said support means extends axially in said reaction chamber, and in which said ports from said reactant distribution means are axially spaced apart along the length of said reaction chamber wall.

17. Apparatus according to claim 16 in which said reactant distribution means includes a wall which is tubular and parallel to said reaction chamber wall, ports being formed in said reactant distribution means to pass reactant into said reaction chamber.

18. Apparatus according to claim 1 in which said wafer carrier includes a mount member to which said support means is fixed.

19. Apparatus according to claim 18 in which insulation means is placed between said wafer carrier and said moving means.

20. Apparatus according to claim 18 in which said closure means includes a seal in an interface region between said reaction chamber and said conditioning chamber to close the said interface region from said conditioning chamber.

21. Apparatus according to claim 18 in which there is a plurality of said supports fixed to said wafer carrier, said supports being slotted to receive the edge of said retainers.

22. Apparatus according to claim 1 in which said reaction chamber is disposed above said conditioning chamber.

23. Apparatus according to claim 1 in which said reaction chamber is disposed below said conditioning chamber.

24. Apparatus according to claim 6 in which said retainers are slanted, and in which there is at least one of said ports directed into the region between adjacent retainers.

25. Apparatus according to claim 6 in which insulation means is placed between said wafer carrier and said moving means.

26. Apparatus according to claim 25 in which there is a plurality of said retainers fixed to said wafer carrier, said supports being slotted to receive the edge of said retainers.

27. Apparatus according to claim 1 in which said reactant distribution means comprises at least one conduit inside said reaction chamber, said conduit having ports for discharging reactant into said reaction chamber.

28. Apparatus according to claim 1 in which said reactant distribution means comprises at least one conduit outside of said reaction chamber, and in which said reaction chamber wall includes ports connected to said conduit.

29. Apparatus according to claim 1 in which said reactant distribution means is formed at least in part by a portion of said reaction chamber wall.

30. Apparatus according to claim 1 in which means is provided to heat said conditioning chamber.

31. Apparatus according to claim 1 in which said wafer carrier includes a plurality of retainers as, and in which each wafer bears against one of said retainers in substantial surface-to-surface contiguity.

32. Apparatus according to claim 1 in which a valve is positioned in the opening to said reaction chamber, so disposed and arranged as to be removable to pass the carrier, and insertable so as to close the said opening when no structure bars said insertion.

33. Apparatus according to claim 32 in which said valve is a gate valve that is laterally slidable into and out of said opening to the reaction chamber.

34. Apparatus according to claim 33 in which said gate valve is adapted also to move axially to close said opening.

35. Apparatus according to claim 1 in which means is provided to move said or wafer carrier into and out of said conditioning chamber.

36. Apparatus according to claim 35 in which a valve is positioned in the opening to said reaction chamber, so disposed and arranged as to be removable to pass the carrier, and insertable so as to close the said opening when no structure bars said insertion.

* * * * *